United States Patent
O'Dowd et al.

(10) Patent No.: US 7,235,983 B2
(45) Date of Patent: Jun. 26, 2007

(54) ONE TERMINAL CAPACITOR INTERFACE CIRCUIT

(75) Inventors: John O'Dowd, County Limerick (IE); Damien McCartney, Limerick (IE); Gabriel Banarie, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/370,764

(22) Filed: Mar. 8, 2006

(65) Prior Publication Data

US 2006/0213270 A1   Sep. 28, 2006

Related U.S. Application Data

(60) Provisional application No. 60/660,415, filed on Mar. 9, 2005.

(51) Int. Cl.
   *G01R 27/26* (2006.01)
   *H03M 3/00* (2006.01)

(52) U.S. Cl. .................. 324/658; 324/679; 341/143

(58) Field of Classification Search ............. 324/658, 324/679; 341/143
   See application file for complete search history.

(56) References Cited

U.S. PATENT DOCUMENTS

| | | | | |
|---|---|---|---|---|
| 5,220,286 A | * | 6/1993 | Nadeem | 330/9 |
| 5,293,169 A | * | 3/1994 | Baumgartner et al. | 341/172 |
| 5,495,414 A | * | 2/1996 | Spangler et al. | 701/45 |
| 5,563,597 A | * | 10/1996 | McCartney | 341/143 |
| 5,973,537 A | * | 10/1999 | Baschirotto et al. | 327/337 |
| 6,147,631 A | * | 11/2000 | Maulik et al. | 341/143 |
| 6,172,630 B1 | * | 1/2001 | Nelson | 341/143 |
| 6,795,006 B1 | * | 9/2004 | Delight et al. | 341/143 |
| 6,879,056 B2 | * | 4/2005 | Kemp et al. | 324/679 |
| 6,970,126 B1 | * | 11/2005 | O'Dowd et al. | 341/143 |
| 7,010,440 B1 | * | 3/2006 | Lillis et al. | 702/65 |

* cited by examiner

*Primary Examiner*—Andrew H. Hirshfeld
*Assistant Examiner*—Timothy J. Dole
(74) *Attorney, Agent, or Firm*—Iandiorio & Teska

(57) ABSTRACT

A one terminal capacitor interface circuit for sensing the capacitance of a capacitor includes a differential integrating amplifier having an input common mode voltage and two summing nodes whose voltage is substantially equal to the input common mode voltage, a switching circuit for charging the capacitor to a first voltage level in a first phase, connecting, in a second phase, the capacitor to one of the summing nodes of the differential amplifier to provide a first output change substantially representative of the difference between the first voltage level and the input common mode voltage, and also representative of the capacitor; charging the capacitor to a second voltage level in a third phase, and connecting, in a fourth phase, the capacitor to the other summing node of the differential amplifier to provide a second output change substantially representative of the difference between the second voltage level and the input common mode voltage, and also representative of the capacitor; the combined first and second output changes representing the capacitance of the capacitor substantially independent of the input common mode voltage.

16 Claims, 7 Drawing Sheets

ONE TERMINAL CAPACITOR INTERFACE CIRCUIT

RELATED APPLICATIONS

This application claims the benefit of U.S. Provisional Application No. 60/660,415 filed Mar. 9, 2005, incorporated by reference herein.

FIELD OF THE INVENTION

This invention relates to an interface circuit for sensing capacitance of a one terminal capacitance, and more particularly to such an interface circuit useful in sigma delta modulators and converters and charge amplifiers or capacitance to voltage converters.

BACKGROUND OF THE INVENTION

A large number of sensors are capacitive—the physical effect being measured is translated into a change in capacitance which can then be measured electrically. In many cases the two terminals of the sensor capacitor are floating, that is, neither are at a fixed potential. This is very convenient when interfacing the sensor to a measurement circuit, as there is no restriction on the circuit topology. A typical interface circuit will apply an excitation to one terminal of the capacitor, and extract the sensor signal from the other terminal.

However, in some cases one of the sensor capacitor terminals is at a fixed potential, for example, ground. This then limits the circuit topologies that can be used. The signal must now be recovered from the same terminal that is used for applying the excitation. In one common method of interfacing to this type of circuit the sensor terminal is connected to a fixed voltage $V_x$ on a first clock phase, and is then connected to a summing node of an integrator in a second phase. This has the effect of transferring a charge equal to $(V_x-V_y)*C_{sensor}$ to the integrator, where $V_y$ is the voltage at the input of the integrator.

The $V_y$ term is a problem. The input of the integrator is nominally at the AC ground point, which can be a fixed voltage but is more often at half the supply voltage. In the latter case the voltage $V_y$ will vary directly with variations on the supply. In both cases the input of the integrator is at a voltage slightly different from the AC ground point, and this voltage difference will depend on the amplifier offset and gain. The gain in particular will vary with supply voltage and temperature. In all cases the variation in $V_y$ will corrupt the charge being transferred from the sensor to the integrator, and will cause an error in the measurement of the sensor output. With these single input integration circuits the integration amplifier offset error and 1/f low frequency noise cannot be easily corrected.

BRIEF SUMMARY OF THE INVENTION

It is therefore an object of this invention to provide an improved one terminal capacitor interface circuit.

It is a further object of this invention to provide such an improved one terminal capacitor interface circuit suitable for use in sigma delta modulators and converters and charge amplifiers or capacitance to voltage converters.

It is a further object of this invention to provide such an improved one terminal capacitor interface circuit in which the output represents the sensed capacitance substantially independent of the input common mode voltage of the interface circuit components.

It is a further object of this invention to provide such an improved one terminal capacitor interface circuit which can cancel amplifier offset error and 1/f low frequency noise.

It is a further object of this invention to provide such an improved one terminal capacitor interface circuit which is applicable to differential capacitor sensors.

The invention results from the realization that an improved one terminal capacitor interface circuit for single or differential capacitor sensing which is independent of input common mode voltage can be achieved using a differential integrating amplifier having an input common mode voltage; a switching circuit for charging the capacitor to a first voltage level in a first phase, connecting, in a second phase, the capacitor to one summing node of the differential amplifier to provide a first output change substantially representative of the difference between the first voltage level and the input common mode voltage; charging the capacitor to a second voltage level in a third phase, and connecting, in a fourth phase, the capacitor to the other summing node of the differential amplifier to provide a second output change substantially representative of the difference between the second voltage level and the input common mode voltage, the combined first and second output changes representing the capacitance of the capacitor substantially independent of the input common mode voltage. The invention also realizes that by chopping or alternately inverting the inputs and outputs of the differential integrating amplifier the amplifier offset and 1/f low frequency noise can be cancelled. The invention is useable in sigma delta modulators and converters charge amplifiers or capacitance to voltage converters.

The subject invention, however, in other embodiments, need not achieve all these objectives and the claims hereof should not be limited to structures or methods capable of achieving these objectives.

This invention features a one terminal capacitor interface circuit for sensing the capacitance of a capacitor. There is a differential integrating amplifier having an input common mode voltage and two summing nodes whose voltage is substantially equal to the input common mode voltage. A switching circuit charges the capacitor to a first voltage level in a first phase and connects, in the second phase, the capacitor to one of the summing nodes of the differential amplifier to provide a first output change substantially representative of the difference between the first voltage level and the input common mode voltage and also representative of the capacitor. The switching circuit also charges the capacitor to a second voltage level in a third phase and connects, in a fourth phase, the capacitor to the other summing node of the differential amplifier to provide a second output change substantially representative of the difference between the second voltage level and the input common mode voltage and also representative of the capacitor. The combined first and second output changes represent the capacitance of the capacitor substantially independent of the input common mode voltage.

In a preferred embodiment the differential integrating amplifier may include a control circuit for controlling the input common mode voltage at the summing nodes to be substantially equal to an applied reference voltage. The differential integrating amplifier may include a control circuit for controlling the output common mode voltage of the amplifier to be substantially equal to an applied reference voltage. The differential integrating amplifier may include a chopper circuit for selectively inverting the inputs and the outputs of the differential integrating amplifier for canceling amplifier offset error and low frequency noise. The chopper circuit may change state at the end of second phase and at the end of the fourth phase.

This invention also features a capacitance to voltage converter circuit for sensing the capacitance of a one terminal capacitor including a differential integrating amplifier having an input common mode voltage and two summing nodes whose voltage is substantially equal to the input common mode voltage. A switching circuit charges the capacitor to a first voltage level in a first phase and connects, in a second phase, the capacitor to one of the summing nodes of the differential amplifier to provide a first output change substantially representative of the difference between the first voltage level and the input common mode voltage and also representative of the capacitor. The capacitor is charged to a second voltage level in a third phase, and connects, in a fourth phase, the capacitor to the other summing node of the differential amplifier to provide a second output change substantially representative of the difference between the second voltage level and the input common mode voltage, and also representative of the capacitor. The combined first and second output changes represent the capacitance of the capacitor substantially independent of the input common mode voltage. A reset switching circuit resets the differential integrating amplifier.

In a preferred embodiment the reset switching circuit may reset the integrating capacitors of the differential integrating amplifier. The differential integrating amplifier may include a control circuit for controlling the input common mode voltage at the summing nodes to be substantially equal to an applied reference voltage. The differential integrating amplifier may include a control circuit for controlling the output common mode voltage of the amplifier to be substantially equal to an applied reference voltage. The differential integrating amplifier may include a chopper circuit for selectively inverting the inputs and the outputs of the differential integrating amplifier for canceling amplifier offset error and low frequency noise.

This invention also feature a capacitive input sigma delta modulator for sensing the capacitance of a one terminal capacitor including at least one integrating stage, a quantizer, and a digital to analog converter having positive and negative reference voltage. The first integrating stage includes a differential integrating amplifier having an input common mode voltage and two summing nodes whose voltage is substantially equal to the input common mode voltage. A switching circuit charges the capacitor to a first voltage level in a first phase, and connects, in a second phase, the capacitor to one of the summing nodes of the differential amplifier to provide a first output change substantially representative of the difference between the first voltage level and the input common mode voltage, and also representative of the capacitor. The capacitor is charged to a second voltage level in a third phase and connects, in a fourth phase, the capacitor to the other summing node of the differential amplifier to provide a second output change substantially representative of the difference between the second voltage level and the input common mode voltage, and also representative of the capacitor. The combined first and second output changes represent the capacitance of the capacitor substantially independent of the input common mode voltage.

In a preferred embodiment the differential integrating amplifier may include a control circuit for controlling the input common mode voltage at the summing nodes to be substantially equal to an applied reference voltage. The differential integrating amplifier may include a control circuit for controlling the output common mode voltage of the amplifier to be substantially equal to an applied reference voltage. The differential integrating amplifier may include a chopper circuit for selectively inverting the inputs and the outputs of the differential integrating amplifier for canceling amplifier offset error and low frequency noise. The first and second voltage levels may be the positive and negative reference voltages of the digital to analog converter of the sigma delta modulator. The first and second voltage levels may be proportional to the positive and negative reference voltages of the digital to analog converter of the sigma delta modulator.

This invention also features a differential capacitor one terminal capacitor interface circuit for sensing the capacitance of first and second capacitors including a differential integrating amplifier having first and second summing nodes and an input common mode voltage. A switching circuit charges a first capacitor of the differential one terminal capacitor to a first voltage level and a second capacitor of the differential one terminal capacitor to a second voltage level in a first phase. In a second phase the first capacitor is connected to the first summing node and the second capacitor to the second summing node of the amplifier to provide first and second output changes substantially representative of the difference between the first and second voltage levels and the input common mode voltage. In a third phase the first capacitor is charged to the second voltage level and the second capacitor is charged to the first voltage level. In a fourth phase the first capacitor is connected to the second summing node and the second capacitor is connected to the first summing node of the amplifier to provide third and fourth output changes substantially representative of the difference between the first and second voltage levels and the input common mode voltage. The combined first, second, third and fourth changes represent the capacitance of the first and second capacitors substantially independent of the input common mode voltage.

In a preferred embodiment the differential integrating amplifier may include a control circuit for controlling the input common mode voltage at the summing nodes to be substantially equal to an applied reference voltage. The differential integrating amplifier may include a control circuit for controlling the output common mode voltage of the amplifier to be substantially equal to an applied reference voltage. The differential integrating amplifier may include a chopper circuit for selectively inverting the inputs and the outputs of the differential integrating amplifier for canceling amplifier offset error and low frequency noise.

This invention also features a capacitance to voltage converter circuit for sensing the capacitance of a differential one terminal capacitor including a differential integrating amplifier having an input common mode voltage, a switching circuit for charging a first capacitor to a first voltage level and a second capacitor to a second voltage level in a first phase. In a second phase the first capacitor is connected to a first summing node and the second capacitor is connected to a second summing node of the amplifier to provide first and second output changes substantially representative of the difference between the first and second voltage levels and the input common mode voltage. In a third phase the first capacitor is charged to the second voltage level and the second capacitor is charged to the first voltage level. In a fourth phase the first capacitor is connected to the second summing node and the second capacitor is connected to the first summing node of the amplifier to provide third and fourth output changes substantially representative of the difference between the first and second voltage levels and the input common mode voltage. The combined first, second, third and fourth changes represent the capacitance of the first and second capacitors substantially independent of the input common mode voltage. A reset switching circuit resets the differential integrating amplifier.

In a preferred embodiment the reset switching circuit may reset the integrating capacitors of the differential integrating amplifier. The differential integrating amplifier may include a control circuit for controlling the input common mode voltage at the summing nodes to be substantially equal to an applied reference voltage. The differential integrating amplifier may include a control circuit for controlling the output common mode voltage of the amplifier to be substantially equal to an applied reference voltage. The differential integrating amplifier may include a chopper circuit for selectively inverting the inputs and the outputs of the differential integrating amplifier for canceling amplifier offset error and low frequency noise.

This invention also features a capacitive input sigma delta modulator for sensing the capacitance of a differential one terminal capacitor including at least one integrating stage, a quantizer and a digital to analog converter having positive and negative reference voltage. The first the integrating stage includes, a differential integrating amplifier having first and second summing nodes and an input common mode voltage, and a switching circuit for charging a first capacitor of the differential one terminal capacitor to a first voltage level and a second capacitor of the differential one terminal capacitor to a second voltage level in a first phase. In a second phase the first capacitor is connected to the first summing node and the second capacitor is connected to the second summing node of the amplifier to provide first and second output changes substantially representative of the difference between the first and second voltage levels and the input common mode voltage. In a third phase the first capacitor is charged to the second voltage level and the second capacitor is charged to the first voltage level. In a fourth phase the first capacitor is connected to the second summing node and the second capacitor is connected to the first summing node of the amplifier to provide third and fourth output changes substantially representative of the difference between the first and second voltage levels and the input common mode voltage. The combined first, second, third and fourth changes represent the capacitance of the first and second capacitors substantially independent of the input common mode voltage.

In a preferred embodiment the differential integrating amplifier may include a control circuit for controlling the input common mode voltage at the summing nodes to be substantially equal to an applied reference voltage. The differential integrating amplifier may include a control circuit for controlling the output common mode voltage of the amplifier to be substantially equal to an applied reference voltage. The differential integrating amplifier may include a chopper circuit for selectively inverting the inputs and the outputs of the differential integrating amplifier for canceling amplifier offset error and low frequency noise. The first and second voltage levels may be the positive and negative reference voltages of the digital to analog converter of the sigma delta modulator. The first and second voltage levels may be proportional to the positive and negative reference voltages of the digital to analog converter of the sigma delta modulator.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
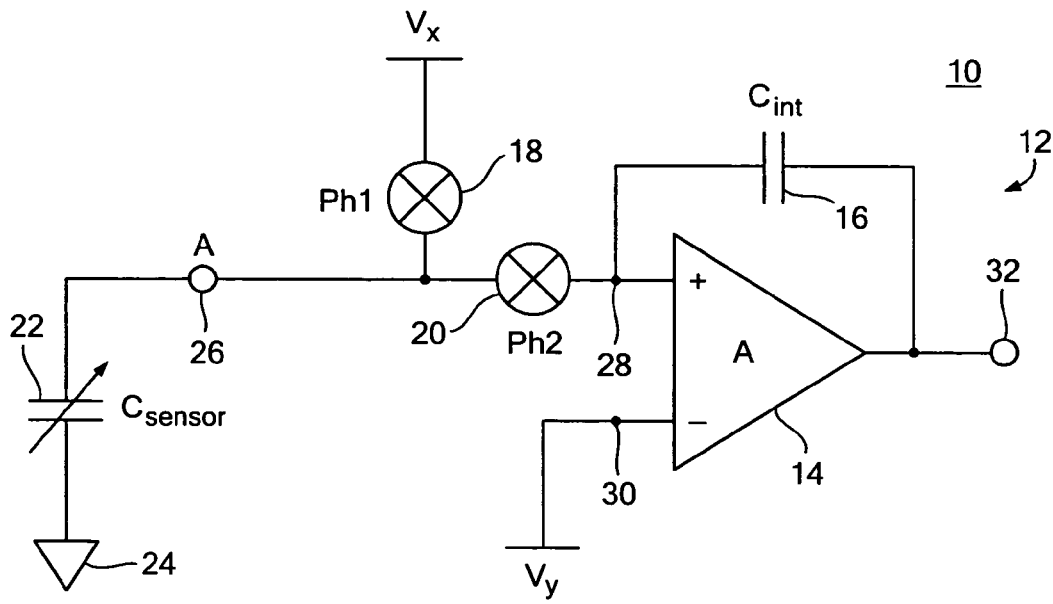
FIG. 1 is a schematic diagram of a prior art one terminal capacitor interface circuit.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1, a conventional prior art one terminal capacitor interface circuit 10 which includes an integrating amplifier 12 including amplifier 14 with feedback or integrating capacitor $C_{int}$ 16. Also included in interface circuit 10 are phased switches 18 and 20. The capacitor 22 whose capacitance is to be sensed has one end grounded at 24, the other end is connected to terminal 26, which is used to both charge and discharge capacitor 22. Interface circuit 10 is operated in two phases. In phase one switch 18 is closed and switch 20 is opened so that capacitor 22 charges to the reference voltage $V_x$. In phase two switch 18 is open and switch 20 is closed so that capacitor 22 is now connected to input or summing point 28 of amplifier 14 and the charge is delivered to the integrating capacitor 16. Any difference between the voltage at input 28 and the $V_y$ voltage at 30 causes amplifier 14 to produce a current to minimize that difference. The current thereby provided transfers a charge equal to $(V_x-V_y)*C_{sensor}$ to the integrating amplifier 12. This in turn gives a change in voltage on output terminal 32 which represents the capacitance of capacitor $C_{sensor}$ 22. Thus a charge equal to $(V_x-V_y)*C_{sensor}$ is transferred to the integrating amplifier 12. $V_y$ is the voltage at the input of the integrator 14 and is the source of a problem. The input of the integrator is normally at the AC ground point which can be a fixed voltage but it often is at half the supply voltage. For example, with a supply voltage of five volts $V_y$ would typically be 2.5 volts. When $V_y$ is thus related to the supply voltage it will vary directly with variations in the supply voltage. In either case, the input of the integrator is at a voltage slightly different than the AC ground point and this voltage difference will depend upon the amplifier offset and gain. The gain in particular will vary with supply voltage and temperature. In all cases the variation in $V_y$ will corrupt the charge being transferred from the sensing capacitor 22 to the integrator 12 and will cause an error in the measurement of the capacitor 22.

Figure 2:
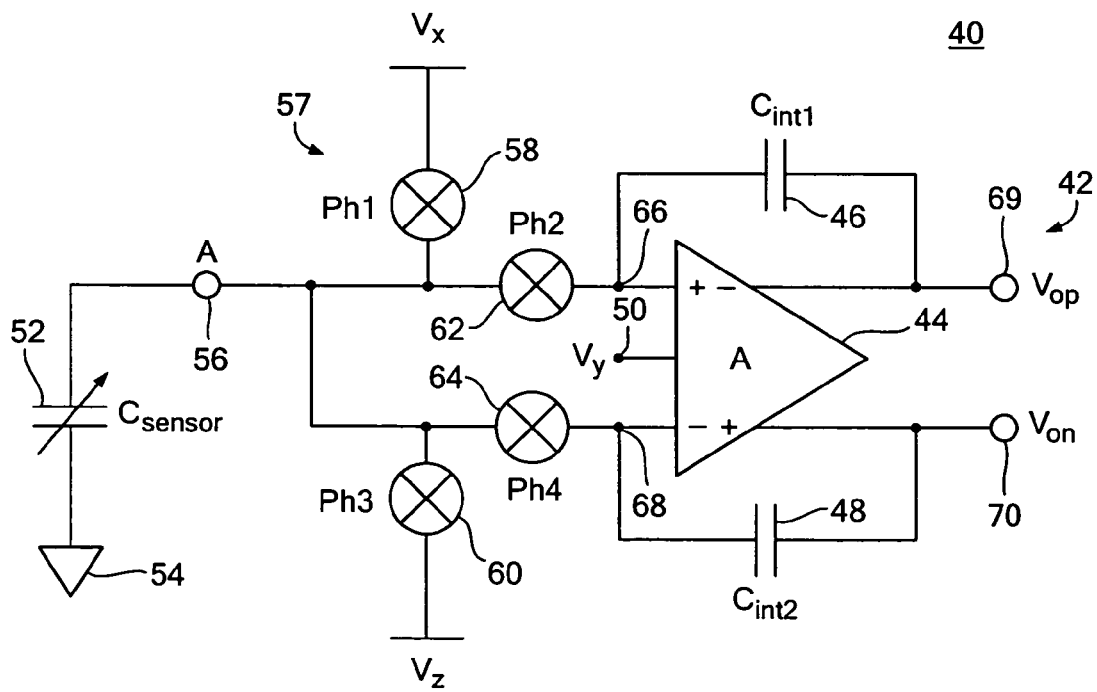
FIG. 2 is a schematic diagram of a one terminal capacitor interface circuit according to this invention.

In accordance with this invention, a one terminal capacitor interface circuit 40, FIG. 2, includes a differential integrator 42 including a differential amplifier 44 with feedback or integrating capacitors $C_{int1}$ 46 and $C_{int2}$ 48 and switching circuit 57 including switches 58, 60, 62 and 64. $V_y$ shown here at input 50 to amplifier 44 is an input common mode voltage of amplifier 44. Amplifier 44 will commonly contain a common mode control circuit which can directly control the input common mode or indirectly by controlling the output common mode, and then relying on the amplifier's feedback network to control the input common mode. In either case the amplifier input terminals 66 and 68 are nominally set to the known common mode voltage $V_y$, typically Vdd/2, i.e., half the supply voltage. The capacitor $C_{sensor}$ 52 to be sensed, has one end connected to ground 54 and the other end connected to terminal 56. There are now two reference voltages: $V_x$ connected to switch 58 and $V_z$ connected to switch 60. There are two other switches 62 and 64 which are connected directly to summing nodes 66 and 68 of amplifier 44. Interface circuit 40 according to this invention operates on a four phase cycle. In phase one switch 58 is closed and switches 62, 64, and 60 are open. Capacitor 52 charges to the voltage $V_x$ in phase one. In phase two switch 58 is open as are switches 64 and 60 but switch 62 is closed and so capacitor 52 is connected to summing node 66 and the charge is delivered to the integrating capacitor $C_{int1}$ 46. Any difference between the voltage on summing node 66 and $V_y$ at 50 causes amplifier 44 to provide an current to equalize those voltages. That current causes a voltage to appear on output terminal $V_{op}$ 69 and that change is a representation of the capacitance of $C_{sensor}$ capacitor 52. In phase three switch 60 is closed, while switches 58, 62 and 64 are open, thus capacitor 52 charges up to $V_z$. In phase four switch 64 is closed while switches 58, 62 and 60 are open. Now capacitor 52 is connected to summing node 68 of amplifier 44 and the charge is exchanged with feedback or integrating capacitor $C_{int2}$ 48. Any difference between the voltage at summing node 68 and $V_y$ on terminal 50 causes an output which is fed back to minimize that difference and that output appears on output terminal $V_{on}$ 70. Thus at the end of phase two the charge transferred to the integrator is $(V_x - V_y)*C_{sensor}$ and at the end of phase four the charge transferred to the integrator is—$(V_z - V_y)*C_{sensor}$. The total charge over all four phases then is $((V_x - V_y) - (V_z - V_y))*C_{sensor}$ or $(V_x - V_z)*C_{sensor}$. Note that therefore the charge transfer term depends on the two reference voltages $V_x$ and $V_z$ only, and no longer is dependent on the $V_y$ term. There are other factors involved in the varying voltage conditions e.g., amplifier offset error, 1/f low frequency noise and amplifier finite gain effects, and so it perhaps is not precise to say that the charge transfer term depends only on $V_x$ and $V_z$ but it certainly depends substantially on them and is substantially not dependent on the $V_y$ term. The interface circuit 40, FIG. 2, is a fully differential integrator commonly used in data converters. The output of the integrator is the difference between the two output terminals $V_{op} - V_{on}$. The two integrating capacitors $C_{int1}$ 46 and $C_{int2}$ 48 are typically substantially equal.

Figure 2A:
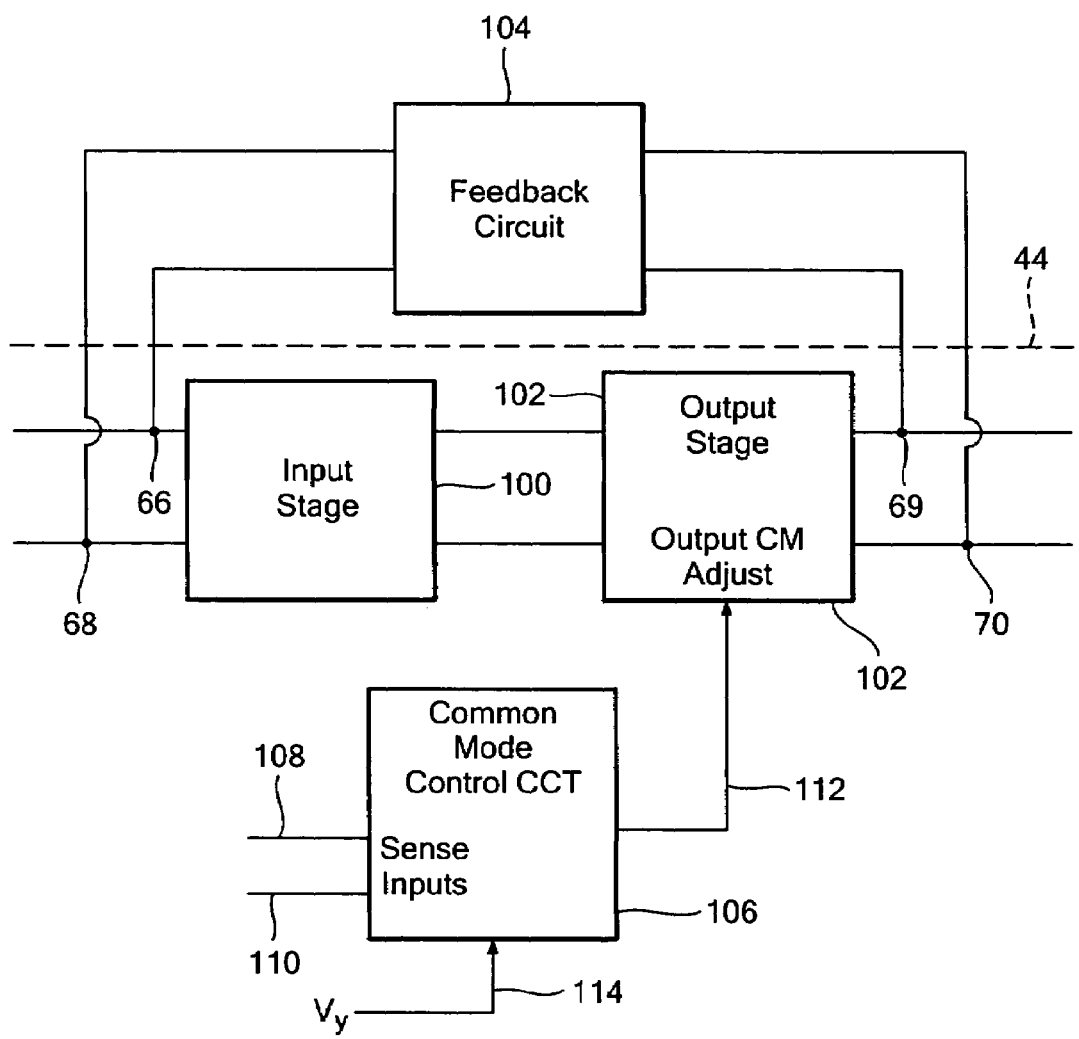
FIG. 2A is a schematic block diagram of a differential amplifier showing a common mode control circuit.

Differential amplifier 44, in addition to an input stage 100 and an output stage 102, typically contains a common mode control circuit 106, as shown in FIG. 2A. As the input and output signals of amplifier 44 are differential, the input signal being processed is represented by the difference between the two input nodes 66 and 68, and the output signal is represented by the difference between the two output nodes 69 and 70. The mean voltage level between the two input nodes is referred to as the input common mode, and the mean voltage level between the two output nodes is the output common mode. The inputs and outputs are linked by the external feedback network 104, which in the case of a differential integrator consists of two integrating capacitors. However, either the input or the output common mode needs to be controlled for the circuit to function properly, otherwise the circuit will find an arbitrary common mode voltage which may restrict the differential voltage range. The function of the common mode control circuit 106 is to control either the input or output common mode voltage by reference to an applied voltage Vy.

The common mode control circuit 106 typically has an output 112 which can be connected to output stage 102 to adjust the output common mode voltage, which in turn will adjust the input common mode voltage via feedback circuit 104. The common mode control circuit also has sense inputs 108 and 110, which either connect to input nodes 66 and 68 to sense the input common mode, or to output nodes 69 and 70 to control the output common mode. The action of the common mode control circuit 106 is to provide an output common mode adjustment signal 112 so that either the input or output common mode is substantially equal to Vy.

Referring again to interface circuit 40, FIG. 2, and examining the operation a little closer, and taking the example of control of the input common mode, and incorporating the offset error in the consideration it can be seen that in phase one the sensor capacitor $C_{sensor}$ 52 is charged to $V_x$. There is a voltage $(V_{op1} - (V_y + V_{ofs}/2))$ across the integrating capacitor. In phase two $C_{sensor}$ 52 is connected to the summing node 66 so that it discharges to $(V_y + V_{ofs}/2)$ and the charge is transferred to the integrating capacitor $C_{int1}$ 46 causing the voltage on the positive output to change to $V_{op2}$. The total charge on both phases must remain constant giving the equation:

$$V_x*C_{sensor} + (V_{op1} - (V_y + V_{ofs}/2))*C_{int} = (V_y + V_{ofs}/2)* \\ C_{sensor} + (V_{op2} - (V_y + V_{ofs}/2))*C_{int} \quad (1)$$

$$(V_{op2} - V_{op1}) = (V_x - (V_y + V_{ofs}/2))*C_{sensor}/C_{int} = \Delta V_{op} \quad (2)$$

The equation is the same for the prior art case.

In this invention two additional phases are added. In phase three the sensor—capacitor 52 is again charged up to a fixed voltage, this time $V_z$. The voltage across the lower integrating capacitor is $(V_{on3} - (V_y - V_{ofs}/2))$. In phase four the sensor capacitor 52 is connected to summing node 68 so that this time $C_{sensor}$ 52 discharges into integrating capacitor $C_{int2}$ 48 causing the voltage on the negative output to change to $V_{on4}$. As before the total charge must be the same for both phases, giving the equation $$V_z*C_{sensor} + (V_{on3} - (V_y - V_{ofs}/2))*C_{int} = (V_y - V_{ofs}/2 * \\ C_{sensor} + (V_{on4} - (V_y - V_{ofs}/2))*C_{int} \quad (3)$$

$$(V_{on4} - V_{on3}) = (V_z - (V_y - V_{ofs}/2))*C_{sensor}/C_{int} = \Delta V_{on} \quad (4)$$

At the end of the four clock phases the change in the integrator output $\Delta V_0$ is given as $$\Delta V_0 = \Delta V_{op} - \Delta V_{on} \quad (5)$$

$$= (V_x - (V_y + V_{ofs}/2)) * C_{sensor}/C_{int} - (V_z - (V_y - V_{ofs}/2)) * C_{sensor}/C_{int} \quad (6)$$

$$= (V_x - V_z + V_{ofs}) * C_{sensor}/C_{int} \quad (7)$$

This result then represents the capacitance of $C_{sensor}$ 52. Note, again, that the output is dependent only on the applied voltages $V_x$ and $V_z$ and not $V_y$. There is here the added problem of the $V_{ofs}$ term but it is only a 5 to 10 milivolt magnitude while $V_y$ was of a 2.5 volt magnitude. Thus, the fraction of error is minimal now with the 5 to 10 milivolt range as compared to the 2.5 volt range. But, even this can be reduced by chopping the input and output to the amplifier. Equation (7) also holds for the case where the common mode at the amplifier output is controlled.

Figure 3:
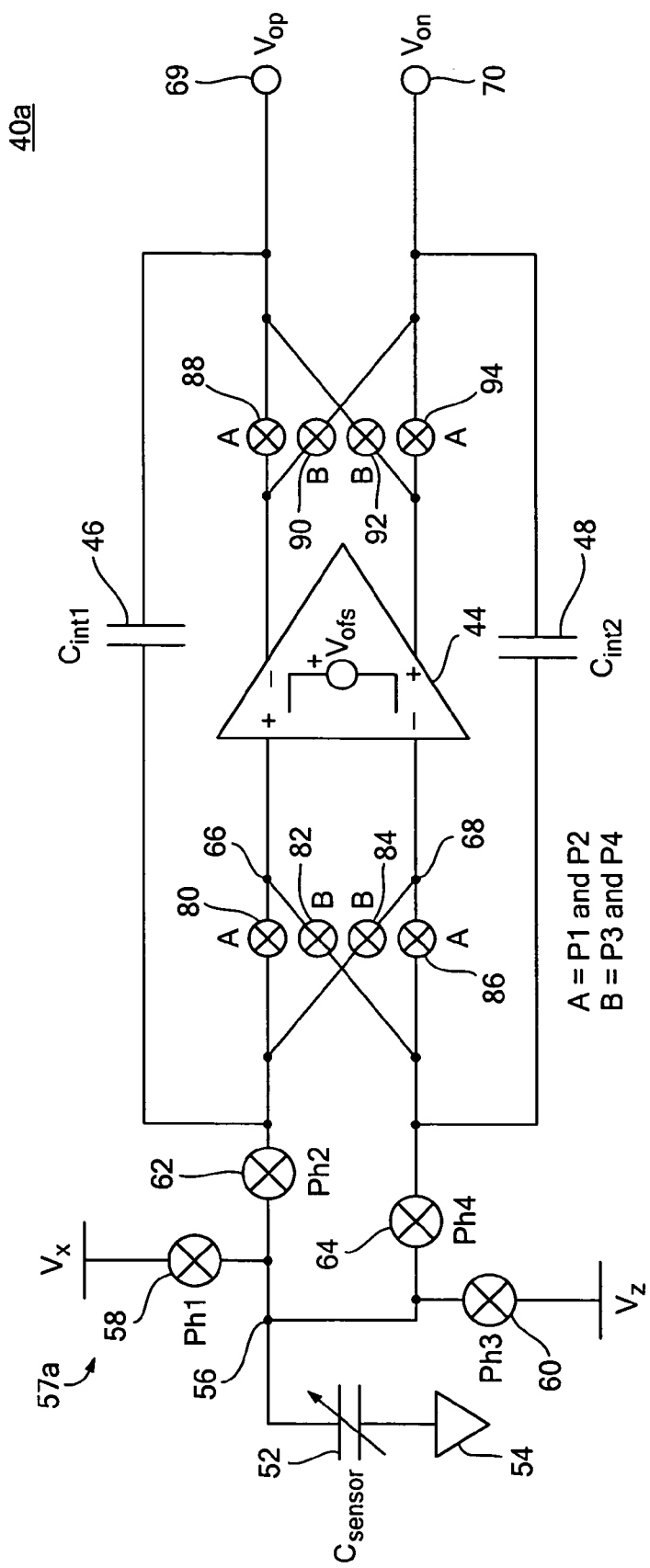
FIG. 3 is a schematic diagram of one terminal capacitor interface circuit similar to that of FIG. 2 with chopping or inverting of the amplifier inputs and outputs to cancel offset error and 1/f noise.

Thus interface circuit 40a, FIG. 3, adds to switching circuit 57a the additional chopping or inverting switches 80, 82, 84, 86 at the input of amplifier 44 and 88, 90, 92 and 94 at the output of amplifier 44. The use of the four phase clock according to this invention has the added advantage of supporting chopping or inverting of the integrator amplifier 44. Chopping is desirable because it eliminates the offset of the amplifier, that is, the $V_{ofs}$ in equation (7). It involves inverting both the inputs and the outputs of amplifier 44 periodically, thus, inverting the offset polarity for half the time. The result is that the positive and negative offsets cancel when the output is averaged over time.

In operation switches 80, 88, 86 and 94 are closed for two phases (phases 1 and 2) of four phase operation while switches 82, 84, 90 and 92 are open, thereby, operating amplifier 44 in the normal way. In the next two phases (phases 3 and 4) of operation of the four phases, switches 80, 88, 86, and 94 are open while switches 82, 84, 90, and 92 are closed. In this mode, the inputs to amplifier 44 are inverted and so are the outputs. The alternate switching of the positive and the negative offset cancels the offsets as averaged over time.

Figure 4:
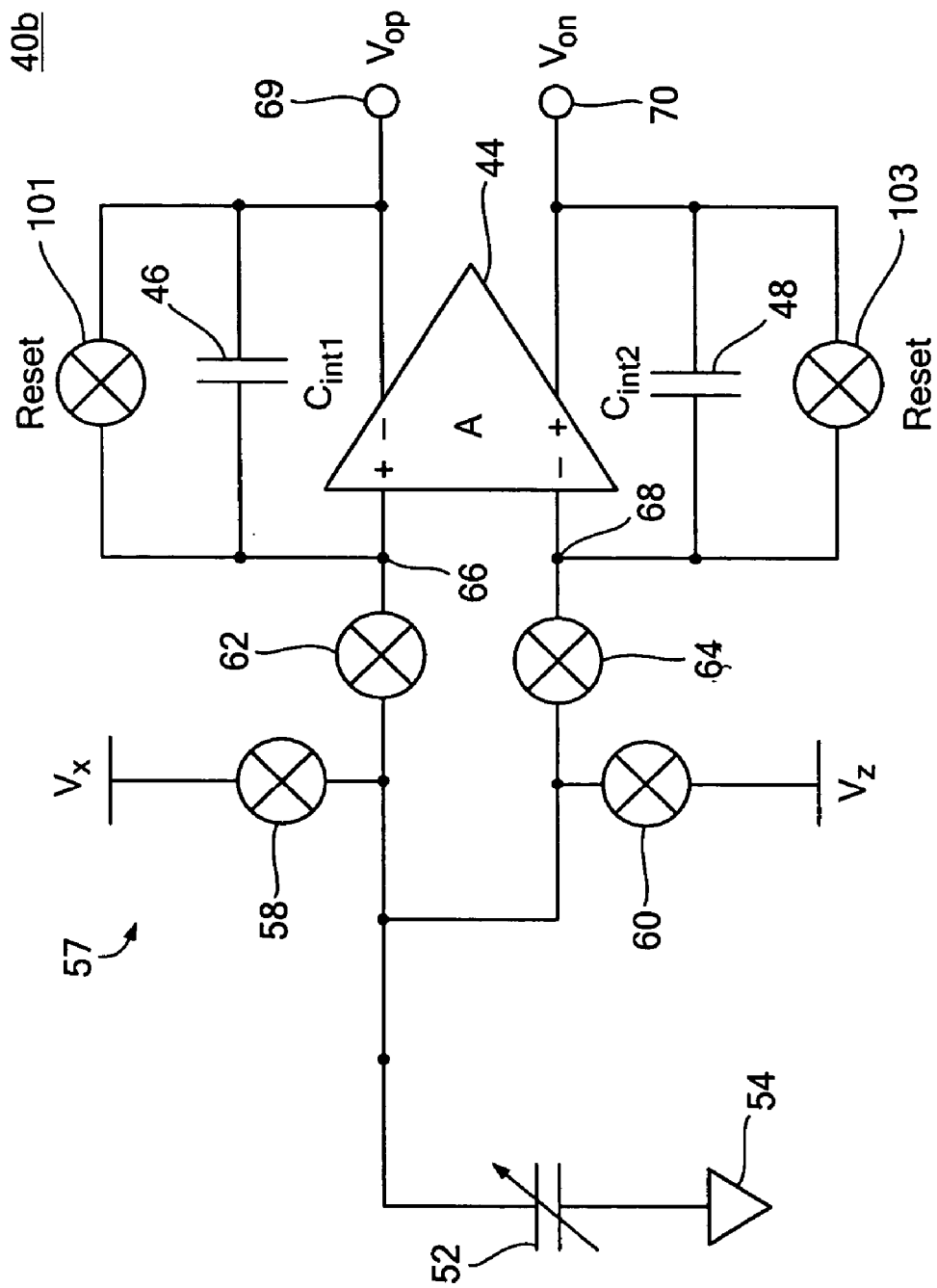
FIG. 4 is a schematic diagram of a one terminal capacitor interface circuit embodied in a charge amplifier or capacitance to voltage converter.
Figure 5:
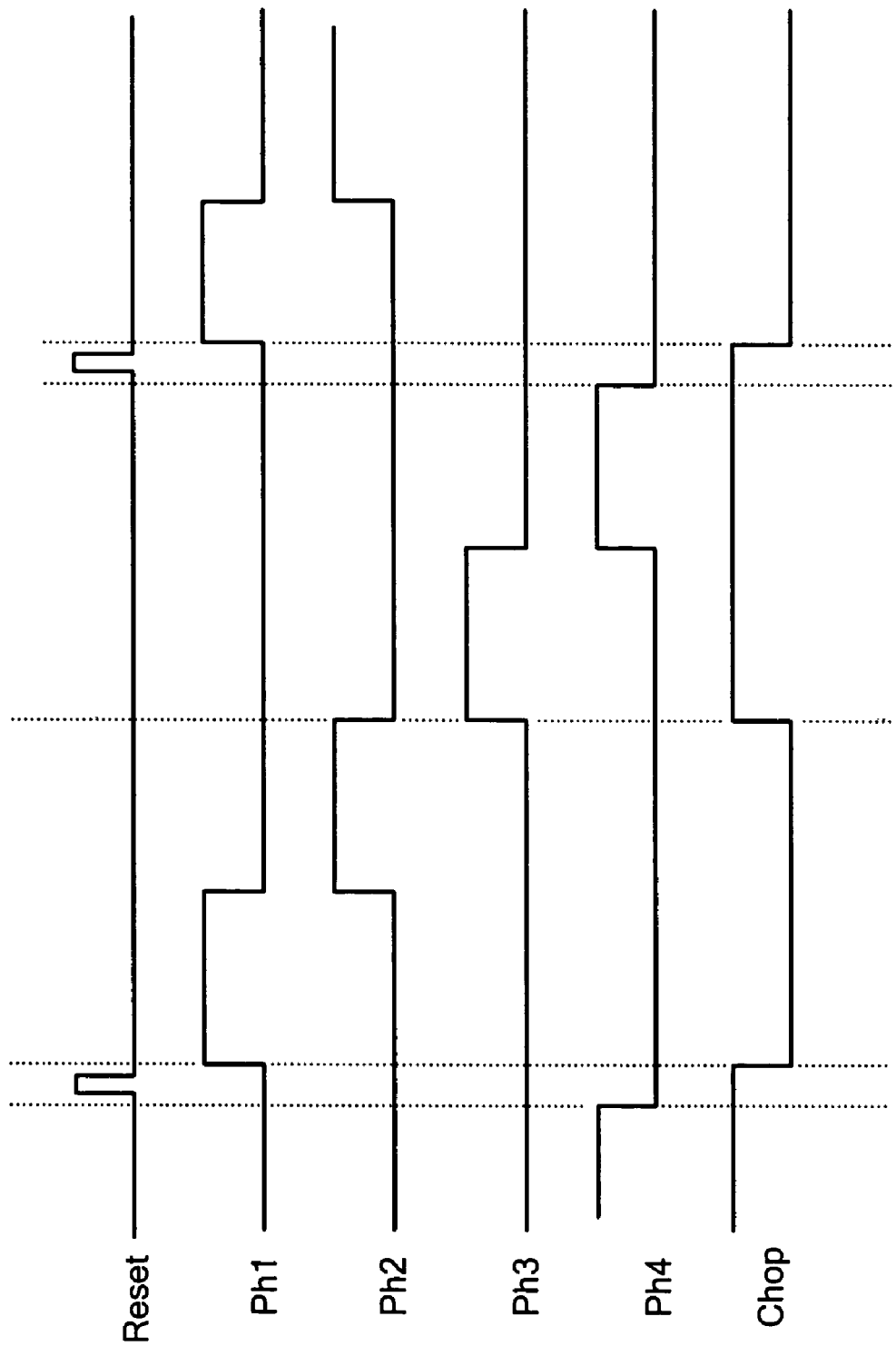
FIG. 5 illustrates timing waveforms occurring in the operation of the charge amplifier of FIG. 4.

The interface circuit of this invention as shown in FIG. 2 or 3, is easily applicable for use in a charge amplifier or capacitive to voltage converter 40b, FIG. 4. In order to facilitate the interface circuit of this invention as a charge amplifier or capacitance to voltage converter it need only be provided with some means to reset the amplifier after each cycle or after a fixed number of cycles. In FIG. 4, circuit 40b has added to it reset switches 101, and 103 which reset their respective integrating capacitors $C_{int1}$ 46 and $C_{int2}$ 48, although any number of different means for resetting integrator 42 may be used. The four phase signals, Ph1, Ph2, Ph3, Ph4 are shown in FIG. 5, along with the reset signal which is operative in FIG. 4. The chop signal which operates switches 80–94 in FIG. 3 is also shown in FIG. 5.

Figure 6:
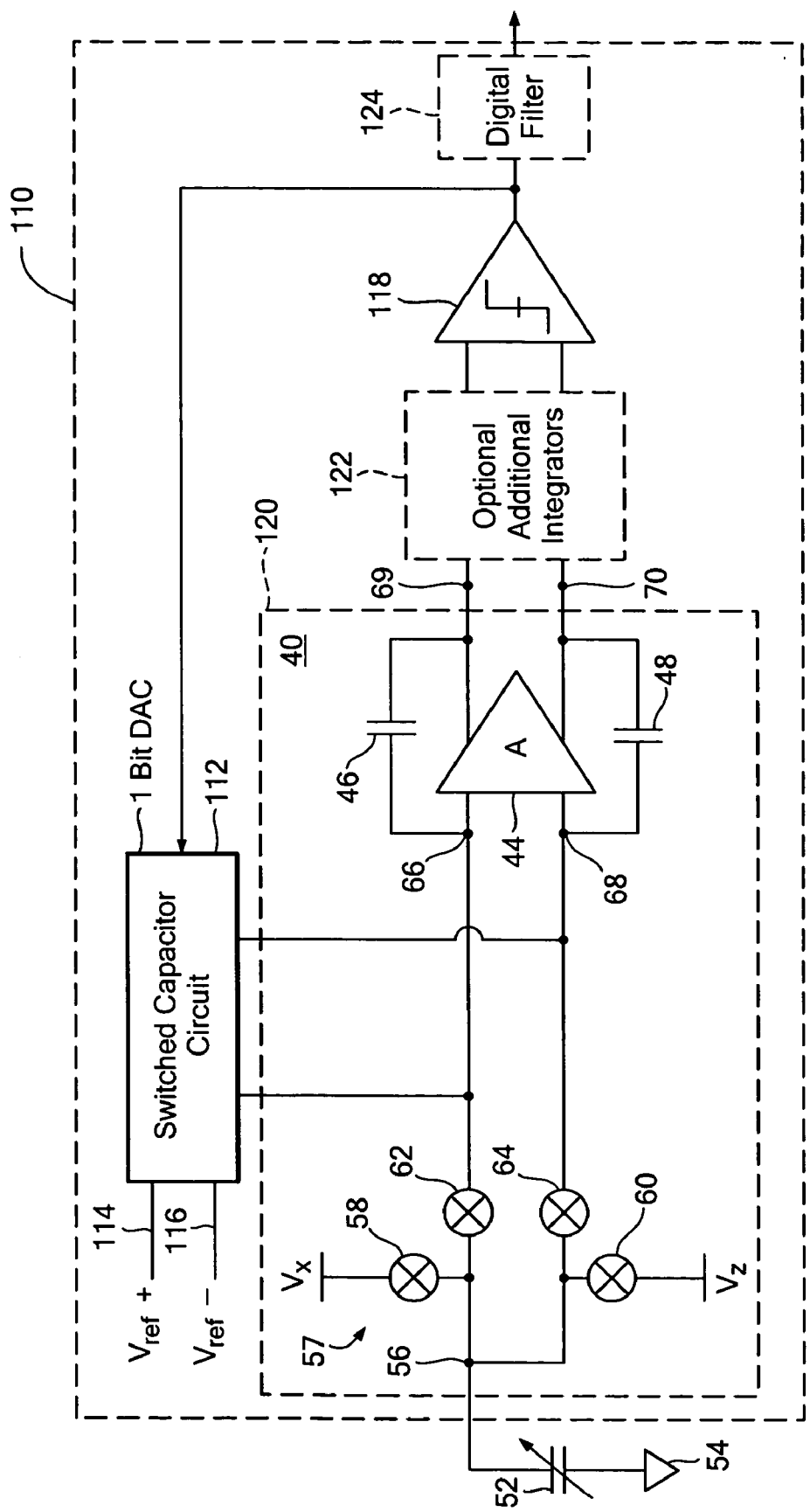
FIG. 6 is a schematic diagram of a one terminal capacitor interface circuit of this invention incorporated in a sigma delta modulator.

Another application of the interface circuit according to this invention is in a sigma delta modulator 110, FIG. 6. Modulator 110 includes switched capacitor circuit 112 having inputs $V_{ref}+$114 and $V_{ref}-$116 which receives an output feedback from quantizer 118. There is also one or more integrator stages 120, 122. The first stage 120 includes the interface circuit 40 according to this invention. While a sigma delta modulator is depicted at 110 in FIG. 6, the addition of a digital filter as at 124 would transform the sigma delta modulator into a sigma delta converter. The quantizer may be implemented using a comparator and often is. The switched capacitor circuit may be replaced with a digital to analog converter or a one bit digital to analog converter if the quantizer is implemented using a comparator. Interface circuit 40 in integrator 120 works in the same way as in the previous descriptions with respect to FIG. 3. Note in FIG. 6 the $V_{ref}+$ at 114 could be used for $V_x$ and $V_{ref}-$ at 116 could be used for $V_z$ or a scaled version of them. Then the circuit will operate in a ratio metric fashion and the conversion result will also be independent of the values $V_x$ and $V_z$ and therefore insensitive to changes even in these voltages.

Figure 7:
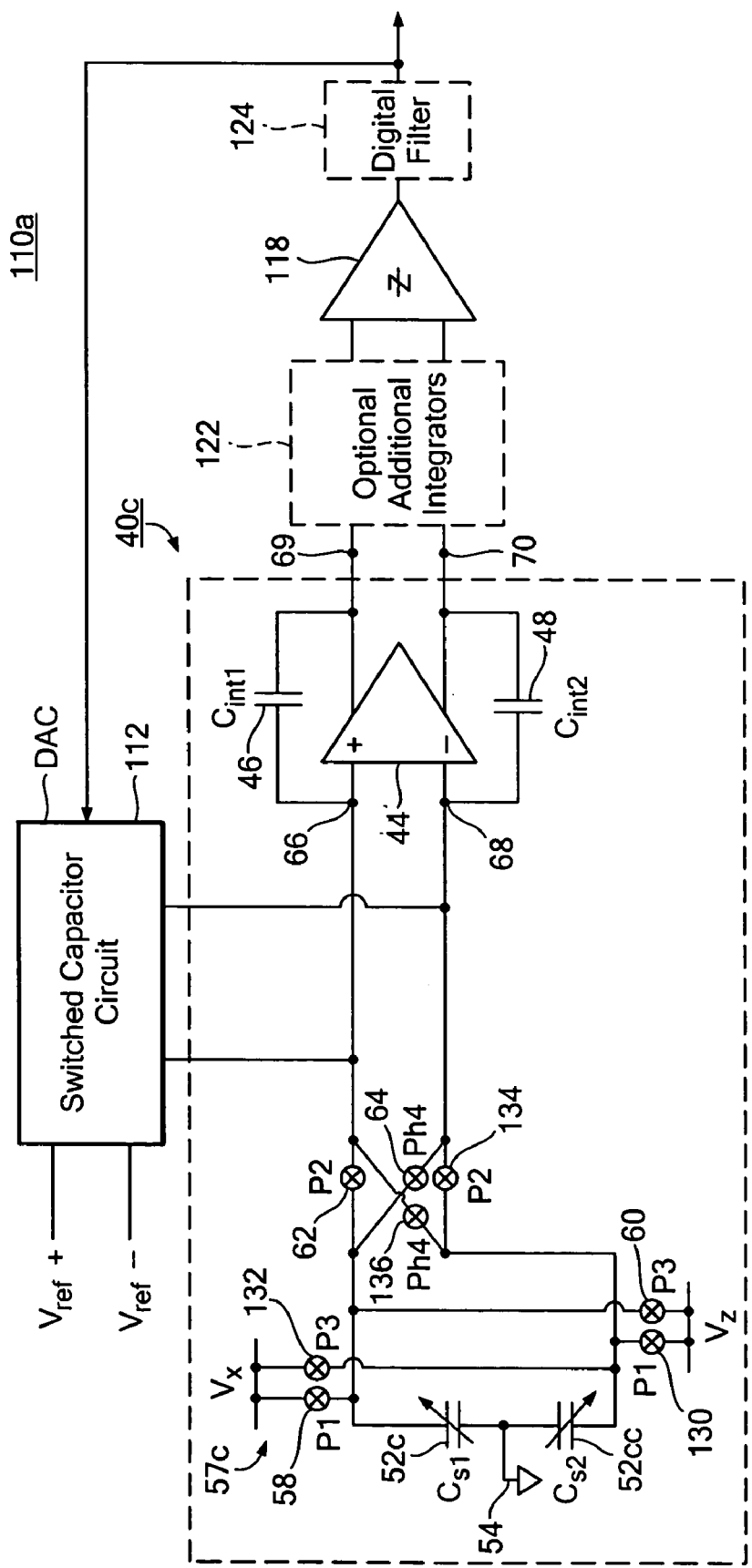
FIG. 7 is a schematic diagram of a differential capacitor one terminal capacitor interface circuit according to this invention.

While thus far the interface circuit of this invention has been shown with only a single one terminal capacitor it is applicable to differential capacitor sensors as well. For example, differential capacitor one terminal capacitor interface circuit 40c, FIG. 7, is shown having differential capacitor sensing $C_{s1}$ 52c and $C_{s2}$ 52cc. It is also shown as a part of a sigma delta modulator or converter 110a. In interface circuit 40c, FIG. 7, switching circuit 57c includes, in addition to switches 58–64, four additional switches, 130, 134, 132 and 136 are closed in phases one, two, three and four, respectively. In operation, then, in phase one sensor capacitor $C_{s1}$ 52c is connected to $V_x$ and sensor capacitor $C_{s2}$ 52cc is connected to reference $V_z$. In phase two sensor capacitor 52c is connected to integrating capacitor $C_{int1}$ 46 while sensor capacitor $C_{s2}$ 52cc is connected to integrating capacitor $C_{int2}$ 48. In phase three the situation is reversed: sensor capacitor $C_{s1}$ 52c is connected to reference $V_z$ while sensor capacitor $C_{s2}$ 52cc is connected to reference $V_x$. In phase four sensor capacitor 52c is connected to integrating capacitor $C_{int2}$ 48 while sensor capacitor $C_{s2}$ 52cc is connected to integrating capacitor $C_{int1}$ 46. In this way both capacitors simultaneously are monitored. This embellishment of switching circuit 57c can be combined with that shown in FIG. 3 so that the offset and 1/f errors can be cancelled as well. Thus the interface circuit of this invention is substantially independent of error terms due to AC ground voltage or due to amplifier offset voltages. This enables a precision measurement of an unknown differential sensor capacitor. The timing of the circuit is not critical; as long as the phases do not overlap the integrator output is valid after four phases. The duration of each phase is not critical either; it needs to be sufficient for the exponential charging transient to be sufficiently complete so that the charge for the sensor capacitor is substantially transferred to the integrator, typically 10 to 11 time constants. The phase durations can be longer than this without materially affecting the circuit performance.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A one terminal capacitor interface circuit for sensing the capacitance of a capacitor comprising:
   a differential integrating amplifier having an input common mode voltage and two summing nodes whose voltage is substantially equal to said input common mode voltage;
   a switching circuit for charging said capacitor to a first voltage level in a first phase, connecting, in a second phase, said capacitor to one of said summing nodes of said differential amplifier to provide a first output change substantially representative of the difference between said first voltage level and said input common mode voltage, and also representative of said capacitor; charging said capacitor to a second voltage level in a third phase, and connecting, in a fourth phase, said capacitor to the other summing node of said differential amplifier to provide a second output change substantially representative of the difference between said second voltage level and said input common mode voltage, and also representative of said capacitor; the combined first and second output changes representing the capacitance of said capacitor substantially independent of said input common mode voltage.

2. The one terminal capacitor interface circuit of claim 1 in which said differential integrating amplifier includes a control circuit for controlling the input common mode voltage at said summing nodes to be substantially equal to an applied reference voltage.

3. The one terminal capacitor interface circuit of claim 1 in which said differential integrating amplifier includes a control circuit for controlling the output common mode voltage of said amplifier to be substantially equal to an applied reference voltage.

4. The one terminal capacitor interface circuit of claim 1 in which said differential integrating amplifier includes a chopper circuit for selectively inverting the inputs and the outputs of said differential integrating amplifier for canceling amplifier offset error and low frequency noise.

5. The one terminal capacitor interface circuit of claim 4 in which said chopper circuit changes state at the end of said second phase and at the end of said fourth phase.

6. A capacitance to voltage converter circuit for sensing the capacitance of a one terminal capacitor comprising:
   a differential integrating amplifier having an input common mode voltage and two summing nodes whose voltage is substantially equal to said input common mode voltage;
   a switching circuit for charging said capacitor to a first voltage level in a first phase, connecting, in a second phase, said capacitor to one of said summing nodes of said differential amplifier to provide a first output change substantially representative of the difference between said first voltage level and said input common mode voltage; and also representative of said capacitor; charging said capacitor to a second voltage level in a third phase, and connecting, in a fourth phase, said capacitor to the other summing node of said differential amplifier to provide a second output change substantially representative of the difference between said second voltage level and said input common mode voltage, and also representative of said capacitor; the combined first and second output changes representing the capacitance of said capacitor substantially independent of said input common mode voltage, and
   a reset switching circuit for resetting the differential integrating amplifier.

7. The capacitance to voltage converter circuit of claim 6 in which said reset switching circuit resets the integrating capacitors of said differential integrating amplifier.

8. The capacitance to voltage converter circuit of claim 6 in which said differential integrating amplifier includes a control circuit for controlling the input common mode voltage at said summing nodes to be substantially equal to an applied reference voltage.

9. The capacitance to voltage converter circuit of claim 6 in which said differential integrating amplifier includes a control circuit for controlling the output common mode voltage of said amplifier to be substantially equal to an applied reference voltage.

10. The capacitance to voltage converter circuit of claim 6 in which said differential integrating amplifier includes a chopper circuit for selectively inverting the inputs and the outputs of said differential integrating amplifier for canceling amplifier offset error and low frequency noise.

11. A capacitive input sigma delta modulator for sensing the capacitance of a one terminal capacitor comprising:
    at least one integrating stage, a quantizer and a digital to analog converter having positive and negative reference voltage, the first integrating stage including
    a differential integrating amplifier having an input common mode voltage and two summing nodes whose voltage is substantially equal to said input common mode voltage;
    a switching circuit for charging said capacitor to a first voltage level in a first phase, connecting, in a second phase, said capacitor to one of said summing nodes of said differential amplifier to provide a first output change substantially representative of the difference between said first voltage level and said input common mode voltage, and also representative of said capacitor; charging said capacitor to a second voltage level in a third phase, and connecting, in a fourth phase, said capacitor to the other summing node of said differential amplifier to provide a second output change substantially representative of the difference between said second voltage level and said input common mode voltage, and also representative of said capacitor; the combined first and second output changes representing the capacitance of said capacitor substantially independent of said input common mode voltage.

12. The capacitive input sigma delta modulator of claim 11 in which said differential integrating amplifier includes a control circuit for controlling the input common mode voltage at said summing nodes to be substantially equal to an applied reference voltage.

13. The capacitive input sigma delta modulator of claim 11 in which said differential integrating amplifier includes a control circuit for controlling the output common mode voltage of said amplifier to be substantially equal to an applied reference voltage.

14. The capacitive input sigma delta modulator of claim 11 in which said differential integrating amplifier includes a chopper circuit for selectively inverting the inputs and the outputs of said differential integrating amplifier for canceling amplifier offset error and low frequency noise.

15. The capacitive input sigma delta modulator of claim 11 in which said first and second voltage levels are the positive and negative reference voltages of the digital to analog converter of said sigma delta modulator.

16. The capacitive input sigma delta modulator of claim 11 in which said first and second voltage levels are proportional to the positive and negative reference voltages of the digital to analog converter of said sigma delta modulator.

* * * * *